US012609273B2

(12) United States Patent
Sannomiya et al.

(10) Patent No.: US 12,609,273 B2
(45) Date of Patent: Apr. 21, 2026

(54) ELECTRON MICROSCOPE, DEVICE FOR MEASURING ELECTRON-PHOTON CORRELATION, AND METHOD FOR MEASURING ELECTRON-PHOTON CORRELATION

(71) Applicant: JAPAN SCIENCE AND TECHNOLOGY AGENCY, Kawaguchi (JP)

(72) Inventors: Takumi Sannomiya, Tokyo (JP); Sotatsu Yanagimoto, Tokyo (JP); Keiichirou Akiba, Tokyo (JP); Hikaru Saito, Tokyo (JP)

(73) Assignee: Japan Science and Technology Agency, Saitama (JP)

( * ) Notice: Subject to any disclaimer, the term of this patent is extended or adjusted under 35 U.S.C. 154(b) by 347 days.

(21) Appl. No.: 18/281,437

(22) PCT Filed: Mar. 7, 2022

(86) PCT No.: PCT/JP2022/009826
§ 371 (c)(1),
(2) Date: Sep. 11, 2023

(87) PCT Pub. No.: WO2022/191152
PCT Pub. Date: Sep. 15, 2022

(65) Prior Publication Data
US 2024/0153736 A1      May 9, 2024

(30) Foreign Application Priority Data

Mar. 12, 2021      (JP) ................................. 2021-040579

(51) Int. Cl.
*H01J 37/26* (2006.01)
*G01N 23/2251* (2018.01)
(Continued)

(52) U.S. Cl.
CPC .......... *H01J 37/26* (2013.01); *G01N 23/2251* (2013.01); *H01J 37/222* (2013.01);
(Continued)

(58) Field of Classification Search
CPC ........ H01J 37/26; H01J 37/222; H01J 37/244; H01J 2237/2445; H01J 2237/2448; H01J 2237/24585; H01J 37/22; G01N 23/2251
See application file for complete search history.

(56) References Cited

U.S. PATENT DOCUMENTS 3,790,781 A * 2/1974 Horl ...................... H01J 37/228
250/491.1
4,469,942 A 9/1984 Srivastava
(Continued)

FOREIGN PATENT DOCUMENTS

CN       116802765 A *  9/2023   ............ H01J 37/228
EP          2690647 A1 *  1/2014   ............ H01J 37/226
(Continued)

OTHER PUBLICATIONS

Kuwahara et al. "The Boersch effect in a picosecond pulsed electron beam emitted from a semiconductor photocathode," Applied Physics Letters, Jul. 7, 2016, 109:013108, 1-4.
(Continued)

*Primary Examiner* — David A Vanore
(74) *Attorney, Agent, or Firm* — Foley & Lardner LLP

(57) ABSTRACT

An electron microscope of an embodiment according to the present invention includes an electron gun for irradiating a sample with electrons; an electron detector for detecting the electrons with which the sample is irradiated; a photon detector for detecting photons emitted from the sample when the sample is irradiated with the electrons; and a computing device that computes, for each of the detected photons, a time difference between the time of irradiation of the sample
(Continued)

with the electron and the time of emission of the photon from the sample, based on the time of detection of the electron by the electron detector and the time of detection of the photon by the photon detector, and that computes electron-photon time correlation indicating the distribution of the time difference.

10 Claims, 6 Drawing Sheets

(51) Int. Cl.
*H01J 37/22* (2006.01)
*H01J 37/244* (2006.01)

(52) U.S. Cl.
CPC ..... *H01J 37/244* (2013.01); *H01J 2237/2445* (2013.01); *H01J 2237/2448* (2013.01); *H01J 2237/24585* (2013.01)

(56) References Cited

U.S. PATENT DOCUMENTS

| | | | | |
|---|---|---|---|---|
| 8,933,402 | B2 * | 1/2015 | Shimizu | H01L 22/12 |
| | | | | 250/311 |
| 10,018,579 | B1 * | 7/2018 | Shriyan | G01N 23/2254 |
| 11,955,310 | B2 * | 4/2024 | Tiemeijer | H01J 37/26 |
| 2007/0023655 | A1 * | 2/2007 | Nishikata | H01J 37/244 |
| | | | | 250/310 |
| 2008/0185509 | A1 | 8/2008 | Knowles | |
| 2013/0068966 | A1 * | 3/2013 | Kociak | H01J 37/244 |
| | | | | 250/458.1 |
| 2014/0131573 | A1 * | 5/2014 | Parker | H01J 37/228 |
| | | | | 250/307 |
| 2014/0339438 | A1 * | 11/2014 | Correns | G01N 23/2254 |
| | | | | 250/459.1 |
| 2024/0153736 | A1 * | 5/2024 | Sannomiya | H01J 37/26 |

FOREIGN PATENT DOCUMENTS

| | | | | | |
|---|---|---|---|---|---|
| EP | 4027133 | A1 | * | 7/2022 | G01N 21/6408 |
| JP | 2008-192617 | A | | 8/2008 | |
| WO | WO-2020225453 | A3 | * | 12/2020 | H01J 37/1474 |

OTHER PUBLICATIONS

Meuret et al., "Complementary cathodoluminescence lifetime imaging configurations in a scanning electron microscope," Ultramicroscopy, 2019 (online Nov. 17, 2018), 197:28-38.

* cited by examiner

FIG. 1

(a) Detection of first electron (b) Detection of second electron (c) Electron-photon time correlation Photon detection signal $t_0$    $t_i$    $t_j$    t (a) Detection of first photon group Photon detection signal $t_0$    $t_i$  $t_j$    t (b) Detection of second photon group Frequency of detection of photons $\gamma$ $g^{(2)}$ 0    $\tau\ (= t_i - t_j)$ (c) Photon-photon time correlation

ELECTRON MICROSCOPE, DEVICE FOR MEASURING ELECTRON-PHOTON CORRELATION, AND METHOD FOR MEASURING ELECTRON-PHOTON CORRELATION

CROSS-REFERENCE TO RELATED APPLICATIONS

This application is the U.S. National Stage of PCT/JP2022/009826, filed Mar. 7, 2022, which claims priority to JP 2021-040579, filed Mar. 12, 2021.

FIELD

The present invention relates to an electron microscope, a device for measuring electron-photon correlation, and a method for measuring electron-photon correlation.

BACKGROUND

A fluorescence lifetime microscope to measure the fluorescence lifetime of a substance and an organism in an excited state is an important tool for clarifying the internal structure and function of a substance and an organism, since it can visualize the substance and organism microscopically. However, because of the diffraction limit of radiated light, a fluorescence lifetime microscope cannot obtain information on a structure smaller than 100 nm, which is particularly important in clarifying the internal structure and function of a substance and an organism.

Attempts to improve spatial resolution with an electron microscope have been made in cathodoluminescence (CL) spectroscopy, in which a sample is irradiated with a pulsed electron beam and spectral characteristics of outgoing light are measured to identify the sample. For example, Non-Patent Document 1 describes a transmission electron microscope (TEM) that irradiates a sample with a pulsed electron beam, using a field emission electron gun (FE electron gun). Non-Patent Document 2 describes a scanning electron microscope (SEM) that irradiates a sample with a pulsed electron beam, using an FE electron gun.

CITATION LIST

Non-Patent Document

Non-Patent Document 1: Makoto Kuwahara, et al. "The Boersch effect in a picosecond pulsed electron beam emitted from a semiconductor photocathode", Appl. Phys. Lett. 109, 013108 (2016); https://doi.org/10.1063/1.4955457.
Non-Patent Document 2: S. Meuret, et al. "Complementary cathodoluminescence lifetime imaging configurations in a scanning electron microscope", Ultramicroscopy 197 (2019) 28-38; https://doi.org/10.1016/j.ultra-mic.2018.11.006.

SUMMARY

Technical Problem

Since the electron microscopes described in Non-Patent Documents 1 and 2 use a pulsed electron gun, the space and energy of the pulsed electron beam with which a sample is irradiated are spread by a space-charge effect, which makes it extremely difficult to reduce spatial resolution to less than 10 nm.

It is an object of the present invention to provide an electron microscope with high spatial resolution.

Solution to Problem

An electron microscope of an embodiment according to the present invention includes: an electron gun for irradiating a sample with electrons; an electron detector for detecting the electrons with which the sample is irradiated; a photon detector for detecting photons emitted from the sample when the sample is irradiated with the electrons; and a computing device that computes, for each of the detected photons, a time difference between the time of irradiation of the sample with the electron and the time of emission of the photon from the sample, based on the time of detection of the electron by the electron detector and the time of detection of the photon by the photon detector, and that computes electron-photon time correlation indicating the distribution of the time difference.

In the above electron microscope, the electron detector preferably detects the electrons transmitted through or reflected by the sample.

In the above electron microscope, the computing device preferably includes an identification module that identifies the sample, based on the electron-photon time correlation.

In the above electron microscope, the identification module preferably computes a fluorescence lifetime or an emission transition probability of the sample from the electron-photon time correlation, and identifies the sample, based on the fluorescence lifetime or the emission transition probability.

In the above electron microscope, the identification module preferably computes, from the electron-photon time correlation, a curve indicating the frequency at which the photon is detected with the time difference when the electron is detected, computes the emission transition probability of the sample from a peak value at the origin of the curve, and computes the time required for the value of the curve to decrease by a factor of $1/e$ as the fluorescence lifetime of the sample.

In the above electron microscope, the computing device preferably includes a storage that stores a parameter value indicating a characteristic of electron-photon time correlation measured in advance regarding one or more known substances or organisms; and the identification module preferably computes the degree of matching between a parameter value of the computed electron-photon time correlation of the sample and a parameter value of electron-photon time correlation of a known substance or organism, and identifies a substance or an organism of the sample as a known substance or organism having a parameter value such that the degree of matching exceeds a predetermined threshold and is a maximum.

In the above electron microscope, the electron detector preferably includes: an emitter that reacts to the electrons with which the sample is irradiated to emit photons, and a photon detection module that detects photons emitted from the emitter to output a detection signal to the computing device.

In the above electron microscope, the photon detector preferably also serves as the photon detection module of the electron detector, and detects the photons emitted from the sample and photons emitted from the emitter to output a detection signal to the computing device.

In the above electron microscope, the electron gun preferably irradiates the sample while scanning the electrons spatially; and the computing device preferably includes an image generation module that generates an image of the sample, based on a spatial change of the electron-photon time correlation.

A device for measuring electron-photon correlation of an embodiment according to the present invention includes: an electron detector for detecting electrons radiated from an electron gun of an electron microscope onto a sample; a photon detector for detecting photons emitted from the sample when the sample is irradiated with the electrons; and a computing device that computes, for each of the detected photons, a time difference between the time of irradiation of the sample with the electron and the time of emission of the photon from the sample, based on the time of detection of the electron by the electron detector and the time of detection of the photon by the photon detector, and that computes electron-photon time correlation indicating the distribution of the time difference.

A method for measuring electron-photon correlation of an embodiment according to the present invention includes: irradiating a sample with electrons; detecting the electrons with which the sample is irradiated; detecting photons emitted from the sample when the sample is irradiated with the electrons; and computing, for each of the detected photons, a time difference between the time of irradiation of the sample with the electron and the time of emission of the photon from the sample, based on the time of detection of the electron and the time of detection of the photon, and computing electron-photon time correlation indicating the distribution of the time difference.

Advantageous Effects of Invention

The present invention provides an electron microscope with high spatial resolution.

BRIEF DESCRIPTION OF DRAWINGS

FIG. 1 schematically shows the configuration of an electron microscope and a device for measuring electron-photon correlation of a first embodiment.

DESCRIPTION OF EMBODIMENTS

Figure 2A:
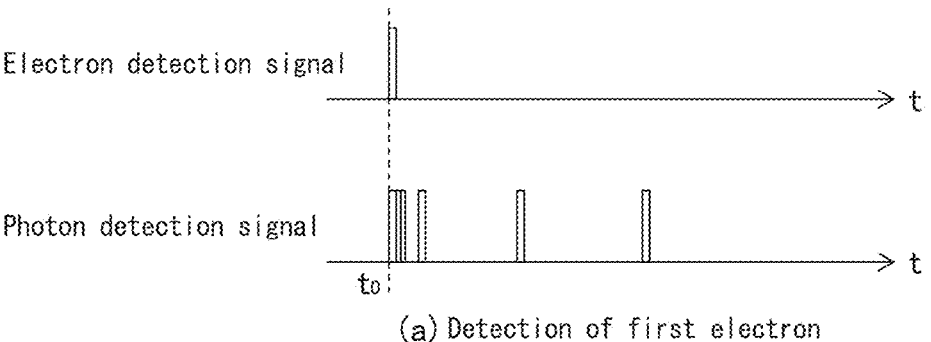
FIG. 2A schematically shows electron-photon time correlation computed by the electron microscope of the first embodiment.
Figure 2A:
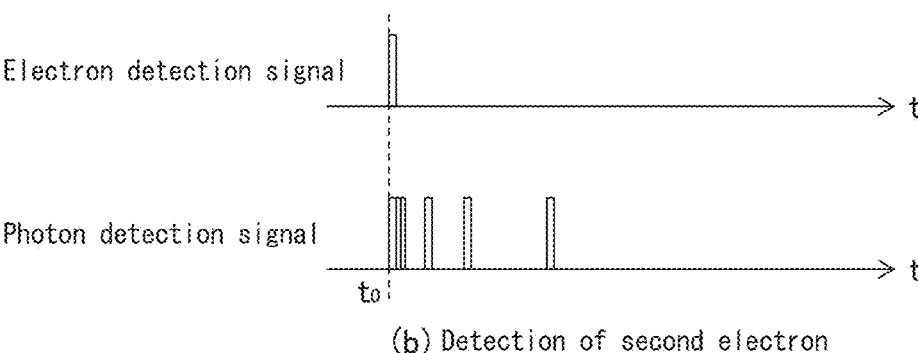
Figure 2A:
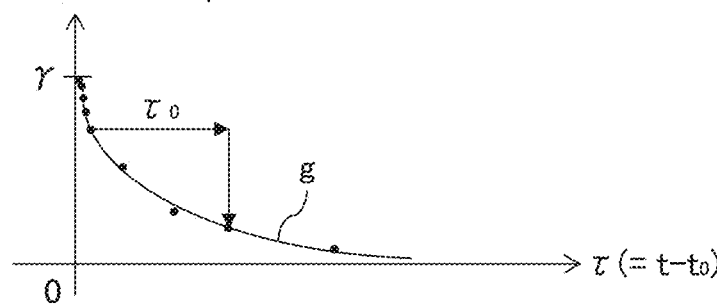

An electron microscope of an embodiment computes, for each detected photon, a time difference between the time of transmission of an electron through a sample and the time of emission of the photon from the sample, and computes electron-photon time correlation indicating the distribution of the time difference. The detection system of the electron microscope is composed of a passive detection module and a computing device that measure the time difference with detection of an electron transmitted through the sample used as a trigger, which eliminates the need for a pulsed electron beam and enables achieving an electron microscope with high spatial resolution less than 10 nm.

Further, the electron microscope identifies the sample, based on the electron-photon time correlation including information such as the fluorescence lifetime of a substance and an organism in an excited state, unlike cathodoluminescence spectroscopy in which spectral characteristics are measured, and thus not only visualizes the sample microscopically but also can obtain information such as the temperature of environment around the sample.

Further, the electron microscope does not need a massive and expensive pulsed electron gun, which enables simplification and cost reduction; thus, an electron microscope for measuring an emission lifetime with high spatial resolution is achieved by just adding a passive detection system to an existing electron microscope body. For this reason, this passive detection system can also be provided as a device for measuring electron-photon correlation that is an attachment to be added to an existing electron microscope.

Preferred embodiments will be described below with reference to the drawings. Note that the present invention is not limited to the following embodiments, and may be appropriately modified within the gist thereof. In the drawings, the same reference numerals are attached to components having the same or corresponding functions, and descriptions thereof may be omitted or simplified.

First Embodiment

Figure 1:
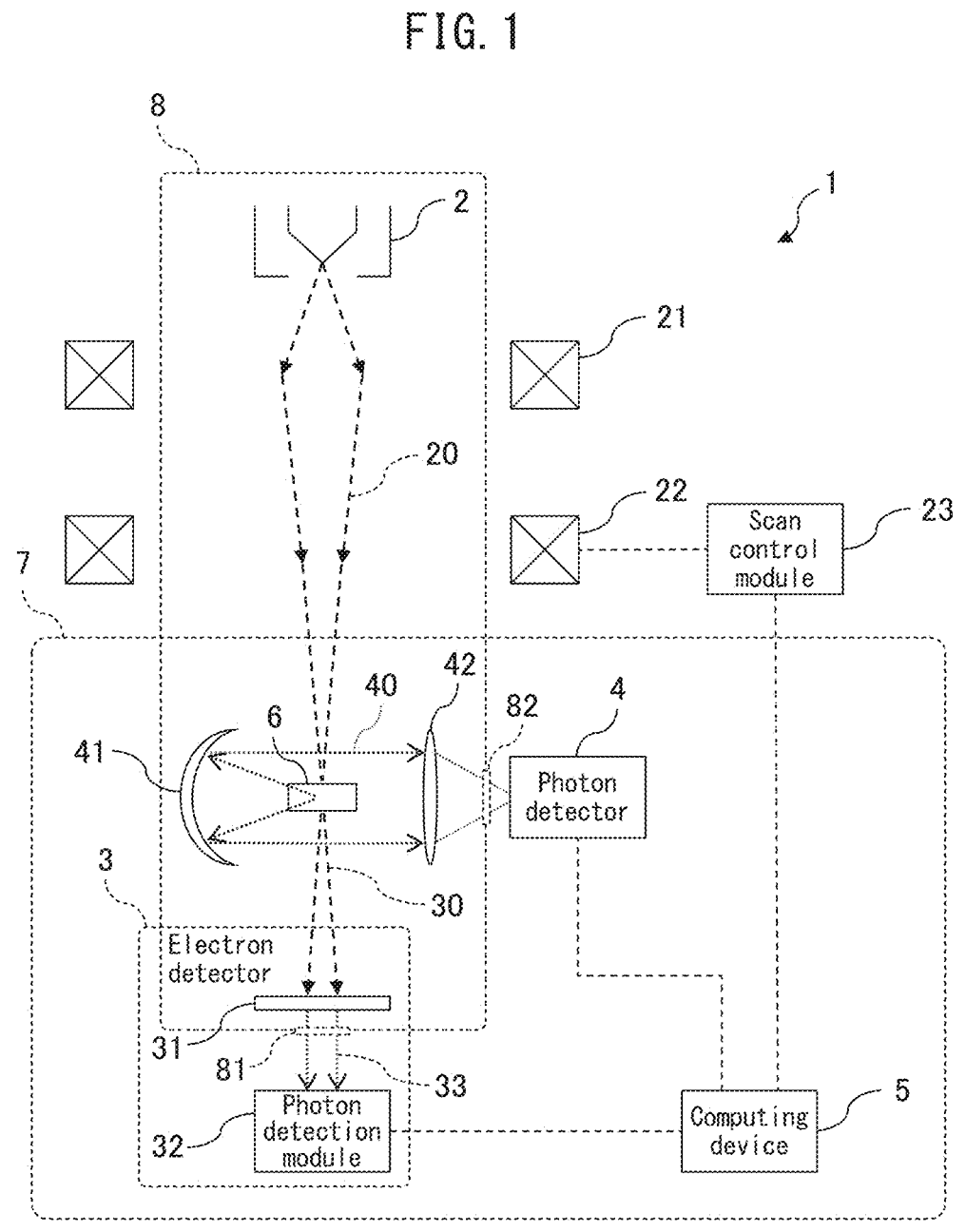

FIG. 1 schematically shows the configuration of an electron microscope 1 and a device 7 for measuring electron-photon correlation of a first embodiment. The electron microscope 1 includes an electron gun 2, an electron detector 3, a photon detector 4, and a computing device 5. The electron microscope 1 is also achieved by adding the device 7 for measuring electron-photon correlation, which is a passive detection system, to an existing electron microscope body 8 including the electron gun 2 and a chamber.

To improve the straightness of electrons 20 radiated from the electron gun 2 toward a sample 6, the electron gun 2 and the sample 6 are disposed in a vacuum chamber of the electron microscope body 8, as shown in FIG. 1. The electron detector 3 is disposed opposite the electron gun 2 with respect to the sample 6 so that electrons 30 transmitted through the sample 6 can be detected. The photon detector 4 is disposed so that photons 40 emitted from the sample 6 can be detected through a photon detection window 82 provided in a wall of the chamber. The computing device 5 is communicably connected at least to the electron detector 3 and the photon detector 4 with wires or by wireless.

The electron gun 2 irradiates the sample 6 with the electrons 20. To suppress a space-charge effect, the electron gun 2 radiates, toward the sample 6, the electrons 20 one by one, which are a continuous electron beam spontaneously emitted from an electron source on a random cycle rather than a pulsed electron beam in which a large number of electrons 20 are temporally compressed. As the electron gun 2 that radiates such a continuous electron beam, an FE electron gun, a thermionic gun, or a Schottky electron gun may be used, and an FE electron gun, which excels in spatial resolution, is preferably used.

As shown in FIG. 1, the electron gun 2 may further include an electron convergent lens 21, an electron scanning deflector 22, and a scan control module 23. The electron convergent lens 21 includes a coil; a magnetic field generated by a current flowing through the coil causes quantum-mechanical wave packets of the electrons 20 to spatially converge by a lens effect. The electron scanning deflector 22 also includes a coil; a current flowing through the coil is controlled by the scan control module 23 and generates a magnetic field that acts on the electrons 20 to spatially scan the position coordinates of the electrons 20 with which the sample 6 is irradiated.

The electron detector 3 detects the electrons 30 transmitted through the sample 6 among the electrons 20 radiated from the electron gun 2. The electron detector 3 has time resolution such that the electrons 30 transmitted through the sample 6 can be detected one by one. The electron detector 3 with such high time resolution is composed of, for example, an emitter 31 and a photon detection module 32, as shown in FIG. 1. The emitter 31 is a scintillator that reacts to the electrons 30 transmitted through the sample 6 to emit photons 33. As the emitter 31 is used a material that has high luminous efficacy and that reacts to the electrons 30 to emit the photons 33 in a short time, e.g., a light-emitting semiconductor material, such as a metal halide perovskite, or a luminescent material of a transition metal complex, such as cerium-doped yttrium silicate (YSO:Ce). The photon detection module 32 detects the photons 33 emitted from the emitter 31 through a photon detection window 81 provided in a wall of the chamber to output a signal indicating that an electron 30 is detected to the computing device 5. As the photon detection module 32 is used, for example, an avalanche photodiode or a photomultiplier tube, which can detect a tiny number of photons 33 efficiently.

The photon detector 4 detects the photons 40 emitted from the sample 6 when the electrons 30 transmit through the sample 6. The photon detector 4 has time resolution such that the photons 40 emitted from the sample 6 can be detected one by one. As the photon detector 4 with such high time resolution, for example, an avalanche photodiode or a photomultiplier tube that can detect the photons 40 one by one is used, similarly to the photon detection module 32 of the electron detector 3. The photon detector 4 may include multiple avalanche photodiodes or photomultiplier tubes. Every time an individual photon 40 emitted from the sample 6 is detected, the photon detector 4 outputs a signal indicating that a photon 40 is detected to the computing device 5. The photon detector 4 may include, upstream thereof, a band-pass filter or a polarizer that allows only photons 40 in a desired wavelength band to pass.

To efficiently detect the photons 40 emitted from the sample 6, the photon detector 4 may include a photon reflecting mirror 41, as shown in FIG. 1. The photon reflecting mirror 41 has, for example, a parabolic shape, and reflects, toward the photon detector 4, photons 40 emitted in directions opposite the photon detector 4 among the photons 40 emitted from the sample 6 disposed at the focal position. The photon detector 4 may be further provided with a photon converging lens 42. The photon converging lens 42 causes the photons 40 emitted from the sample 6 to spatially converge, thereby guiding them to the photon detector 4.

The photon detector 4 may also serve as the photon detection module 32 of the electron detector 3. In this case, the photon detection windows 81 and 82 of the chamber of the electron microscope body 8 are provided close to each other or are the same window, and the emitter 31 may be provided as a substrate having the sample 6 thereon. The photon detector 4 detects the photons 40 emitted from the sample 6 and the photons 33 emitted from the emitter 31 to output a detection signal to the computing device 5. To detect the photons 40 emitted from the sample 6 and the photons 33 emitted from the emitter 31 separately, the photon detector 4 may include a filter that allows only one of the photons 40 and 33 to pass and a filter that allows only the other photons to pass. In this case, the photon detector 4 may include a first detection module for detecting the photons 40 emitted from the sample 6, and a second detection module for detecting the photons 33 emitted from the emitter 31. This simplifies the electron microscope 1.

The computing device 5 includes a processor, a memory, and a communication interface, which are not shown in the figures. As the computing device 5 is used, for example, a personal computer (PC). The processor is an example of the identification module and the image generation module, and includes one or more operating circuits and a peripheral circuit thereof. The memory is an example of the storage, and includes a hard disk drive (HDD), an optical storage medium, a semiconductor memory, such as a random access memory (RAM) and a read-only memory (ROM), or a storage medium that is a combination of these. The communication interface (I/F) connects the processor to the electron detector 3, the photon detector 4, and the scan control module 23 of the electron gun 2 with wires or by wireless, enabling the processor to communicate with the electron detector 3, the photon detector 4, and the scan control module 23 of the electron gun 2.

The computing device 5 computes, for each detected photon 40, a time difference between the time of transmission of the electron 30 through the sample 6 and the time of emission of the photon 40 from the sample 6, based on the time of detection of the electron 30 by the electron detector 3 and the time of detection of the photon 40 by the photon detector 4. The computing device 5 then computes electron-photon time correlation indicating the distribution of the computed time difference, through a procedure described below.

FIG. 2A schematically shows electron-photon time correlation computed by the electron microscope 1 of the first embodiment.

(a) of FIG. 2A schematically shows an example of the electron detection signal and the photon detection signal received by the computing device 5 from the electron detector 3 and the photon detector 4, respectively, via the communication interface when a first electron transmits through the sample 6. Similarly, (b) of FIG. 2A schematically shows an example of the electron detection signal and the photon detection signal received by the computing device 5 from the electron detector 3 and the photon detector 4, respectively, via the communication interface when a second electron transmits through the sample 6. The abscissas in (a) and (b) of FIG. 2A represent time t, and each pulse signal indicates that an electron 30 or a photon 40 is detected.

When an electron 30 is transmitted through the sample 6, the computing device 5 first receives a signal, such as shown in (a) and (b) of FIG. 2A, indicating that the electron 30 transmitted through the sample 6 is detected, from the electron detector 3. Simultaneously, the computing device 5 receives signals each indicating that a photon 40 of a photon group emitted by transmission of the electron 30 through the sample 6 is detected, from the photon detector 4. Thereafter the computing device 5 receives signals each indicating that a photon 40 of a photon group spontaneously emitted from atoms of the sample 6 in an excited state is detected, from the photon detector 4; the frequency of reception of these signals decreases with the time elapsed since the transmission of the electron 30 through the sample 6.

For each detected photon 40, the computing device 5 computes a time difference $\tau = t - t0$ from the time t0 of detection of the electron 30 by the electron detector 3 until the time t of detection of the photon 40 by the photon detector 4. Until a necessary number of photons 40 for computing electron-photon time correlation satisfying a required accuracy is detected, the computing device 5 computes the time difference $\tau$ for each detected photon 40 every time an electron 30 (a first electron, a second electron, . . . ) is transmitted through the sample 6. The interval from radiation of a first electron until the next radiation of a second electron by the electron gun 2 is adjusted in advance, for example, depending on the length of an expected fluorescence lifetime of the sample 6 to be identified.

The computing device 5 can compute the time difference $\tau$ through a digital process, based on the time of detection of the electron 30 by the electron detector 3 and the time of detection of the photon 40 by the photon detector 4, but may compute the time difference through an analog process. In this case, the computing device 5 uses, for example, an analog correlator that excels in time resolution, such as a time-to-amplitude converter, to compute the time of detection of the photon 40 by the photon detector 4, as the time difference $\tau$, with detection of the electron 30 by the electron detector 3 used as a trigger.

There is a time difference between a response time from when the electron detector 3 detects an electron 30 until it outputs a signal and a response time from when the photon detector 4 detects a photon 40 until it outputs a signal. Thus, a delay line for canceling such a difference between the response times may be interposed between the electron detector 3 and the computing device 5 or between the photon detector 4 and the computing device 5.

From the values of the time difference $\tau$ between the time of transmission of an electron 30 through the sample 6 and the time of emission of a photon 40 from the sample 6, the computing device 5 computes the curve g of electron-photon time correlation indicating the distribution of the time difference $\tau$ shown in (c) of FIG. 2A. The abscissa of (c) of FIG. 2A represents the time difference $\tau$, and the ordinate of (c) of FIG. 2A represents the frequency at which a photon 40 is detected with the time difference $\tau$ when an electron 30 is detected.

The curve g of electron-photon time correlation typically has a substantially exponential waveform, and is thus approximated, for example, by the least-squares method with the following Expression (1) using parameter values ($\gamma$, $\tau0$) indicating the characteristics of the curve g. As the curve g, FIG. 2A shows the value of the following Expression (1) decreased by the uncorrelated value (=1).

[Expression 1]
$$g(\tau) = 1 + \gamma e^{-\frac{\tau}{\tau_0}} \qquad (1)$$

Since the electron-photon time correlation computed in this way is characteristic of the substance constituting the sample 6 and its structure, the identification module of the computing device 5 can identify the sample 6 by comparing the computed electron-photon time correlation of the sample 6 with a sample of known electron-photon time correlation. To this end, the storage of the computing device 5 stores, for example, parameter values ($\gamma'$, $\tau0'$) indicating the characteristics of a curve g of electron-photon time correlation measured in advance regarding one or more known substances and organisms. For each known substance or organism, the identification module of the computing device 5 then computes the degree of matching d between the parameter values of its electron-photon time correlation and those of the computed electron-photon time correlation by the following Expression (2).

$$1/d = k_1(\gamma - \gamma')^2 + k_2(\tau0 - \tau0')^2 + 1 \qquad (2)$$

where $k_1$ and $k_2$ are weighting factors of the respective parameters and are appropriately set.

For example, when both the weighting factors $k_1$ and $k_2$ are 1, the minimum and maximum of the degree of matching d are 0 and 1, respectively. Of known substances and organisms, the identification module of the computing device 5 can identify the substance and organism of the sample 6 as one having parameter values such that the degree of matching d with the computed parameter values of the sample 6 exceeds a predetermined threshold and is a maximum. The predetermined threshold is determined in advance, for example, by actual measurement, as the lower limit of the degree of matching d at which the substance and organism of the sample 6 can be identified as a known substance and organism to be compared.

The computing device 5 can compute, for example, $\gamma$ from a peak value at the origin ($\tau = 0$) of the curve g of the electron-photon time correlation as a parameter value indicating the characteristic of the curve g, and compute the emission transition probability of the sample 6 from $\gamma$. As another parameter value, the computing device 5 can compute the time $\tau0$ required for the value of the curve g of the electron-photon time correlation to decrease by a factor of 1/e with respect to a baseline of 1 as the fluorescence lifetime $\tau0$ of the sample 6. Since the fluorescence lifetime $\tau0$ includes environmental information such as the temperature of the sample 6, information such as the temperature of environment around the sample 6 can also be obtained, based on the deviation from the value of fluorescence lifetime $\tau0$ at a known temperature measured in advance. Further, from $\gamma$ can be calculated an emission transition probability, which is a parameter value that has not been able to be measured with a fluorescence lifetime microscope that radiates light. Thus, information on the substance and organism that has not been observed so far may be revealed. As the parameter values indicating the characteristics of the curve g may be used a characteristics value other than the fluorescence lifetime $\tau0$ and $\gamma$.

Figure 2B:
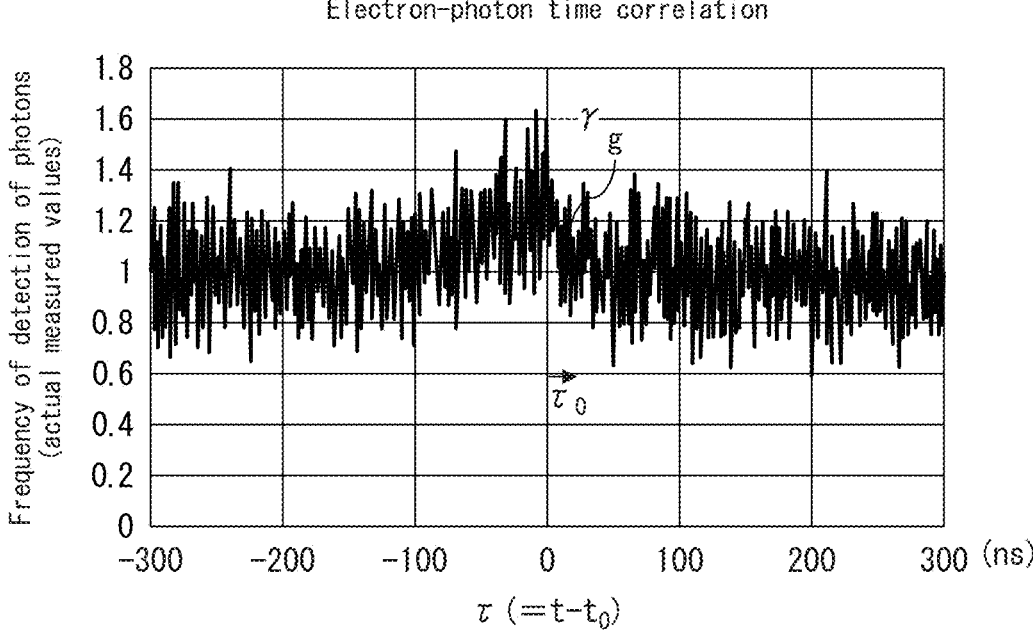
FIG. 2B shows an example of electron-photon time correlation obtained in actual measurement with the electron microscope of the first embodiment.

FIG. 2B shows an example of electron-photon time correlation obtained in actual measurement with the electron microscope of the first embodiment. The electron-photon time correlation shown in FIG. 2B was measured using nanodiamond as the sample 6 and YSO:Ce as the emitter 31, which reacts to electrons 30 transmitted through the nanodiamond to emit photons 33. This measurement was conducted by irradiating the sample 6 with electrons 20 having a current value of approximately 2.5 pA at a room temperature for approximately 1000 seconds until a curve g of electron-photon time correlation with a necessary accuracy was obtained.

The abscissa of FIG. 2B represents the time difference $\tau = t - t0$ from a reference time t0 of detection of a photon 33 by the photon detection module 32 of the electron detector 3 until the time of detection of a photon 40 by the photon detector 4. The ordinate of FIG. 2B represents actual measured values of the frequency at which a photon 40 is detected with the time difference $\tau$ when a photon 33 is detected, and is greater than that of the electron-photon time correlation shown in FIG. 2A by the uncorrelated value (=1).

The curve g of the electron-photon time correlation shown in FIG. 2B differs from that of the electron-photon time correlation shown in FIG. 2A in that the curve g is also measured in the region where the time difference τ is minus. This is because the reference time of the time difference τ of the abscissa of FIG. 2A is the time of detection of an electron 30 whereas that of the time difference τ of the abscissa of FIG. 2B is the time of detection of a photon 33. As shown in FIG. 1, the electrons 30 are indirectly detected via the photons 33. However, since the emitter 31 such as YSO:Ce used as a scintillator generally has a fluorescence lifetime, the photon detection module 32 of the electron detector 3 detects a photon spontaneously emitted from an atom of the emitter 31 in an excited state after detection of a photon 40 by the photon detector 4. In this case, the time difference τ=t−t0 from the reference time t0 of detection of a photon 33 until the time t of detection of a photon 40 is minus. In other words, the curve g in the region where the time difference τ is minus represents the characteristics of YSO:Ce of the emitter 31 rather than those of nanodiamond of the sample 6. Electron-photon time correlation measured with the electron microscope 1 is characterized by such asymmetric data between the plus and minus regions of the time difference τ.

Although FIG. 2B schematically shows actual measured values and does not accurately fit them, the fluorescence lifetime τ0=approximately 20 ns and γ=approximately 0.6 are obtained as parameter values indicating the characteristics of nanodiamond of the sample 6 from the curve g of the electron-photon time correlation shown in FIG. 2B. When the fluorescence lifetime τ0 and γ are calculated in FIG. 2B, values decreased by the uncorrelated value (=1) are used as the frequency of detection of photons.

The computing device 5 can generate an image of the sample 6, based on a spatial change of the electron-photon time correlation, by the scan control module 23 of the electron gun 2 causing the sample 6 to be irradiated while scanning the electrons 20 spatially. To this end, for example, when computing electron-photon time correlation, the computing device 5 receives the position coordinates on the sample 6 irradiated with the electrons 20 by the electron gun 2 from the scan control module 23 via the communication interface, and stores, in the storage, the received position coordinates and data of the computed electron-photon time correlation in association with each other. When measurement of a target area of the sample 6 is finished, the computing device 5 can generate an image of the target area of the sample 6 by computing the characteristic values of the electron-photon time correlation corresponding to the respective position coordinates on the sample 6. For example, information on the structure of a defect of the sample 6 is obtained from the image of the sample 6 thus obtained.

The electron microscope 1 may identify the sample 6 by taking account of photon-photon time correlation described below, besides the electron-photon time correlation shown in FIG. 2A.

Figure 3:
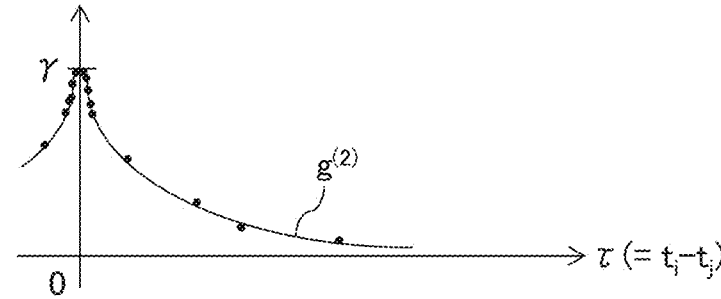
FIG. 3 schematically shows photon-photon time correlation computed by the electron microscope of the first embodiment.

FIG. 3 schematically shows photon-photon time correlation computed by the electron microscope 1 of the first embodiment.

(a) and (b) of FIG. 3 schematically show examples of the photon detection signal received by the computing device 5 from the photon detector 4 via the communication interface. The abscissas in (a) and (b) of FIG. 3 represent time t, and each pulse signal indicates that a photon 40 is detected.

Photon-photon time correlation is measured with the photon detector 4 including detection modules such as at least two avalanche photodiodes or photomultiplier tubes.

When an electron 30 is transmitted through the sample 6, the computing device 5 receives signals, such as shown in (a) and (b) of FIG. 3, indicating that photons 40 of a photon group emitted from the sample 6 by transmission of the electron 30 through the sample 6 are detected, from the photon detector 4.

For each combination of a first photon detected by a detection module of the photon detector 4 and a second photon detected by another detection module thereof, the computing device 5 computes a time difference τ=ti−tj between the time ti of detection of the first photon and the time tj of detection of the second photon by the photon detector 4. Until a necessary number of photons 40 for computing photon-photon time correlation satisfying a required accuracy are detected, the computing device 5 computes the time difference τ for each combination of the first and second photons of individual detected photon groups (a first photon group, a second photon group, . . . ).

Then the computing device 5 computes the curve $g^{(2)}$ of photon-photon time correlation indicating the distribution of the time difference τ shown in (c) of FIG. 3. The abscissa of (c) of FIG. 3 represents the time difference τ, and the ordinate of (c) of FIG. 3 represents the frequency at which another photon is detected with the time difference τ after a photon is detected at time t. In general, the curve $g^{(2)}$ of photon-photon time correlation is computed with a second-order autocorrelation function shown in the following Expression (3), and < > in the expression indicates an average of the intensity I of incident light over time t.

[Expression 2]

$$g^{(2)}(\tau) = \frac{\langle I(t)I(t+\tau)\rangle}{\langle I(t)\rangle\langle I(t+\tau)\rangle} \tag{3}$$

The photon-photon time correlation computed in this way is also characteristic of the substance constituting the sample 6 and its structure. In particular, when the sample 6 is a substance that emits photons 40 simultaneously with the transmission of an electron 30 through the sample 6, it can be seen that the peak position of the curve $g^{(2)}$ of the photon-photon time correlation corresponds to the time of transmission of an electron 30 through the sample 6, without using detection of the electron 30 by the electron detector 3 as a trigger. Thus the computing device 5 can also compute the fluorescence lifetime or the emission transition probability of the sample 6 from the curve $g^{(2)}$ of the electron-photon time correlation, as in the case of the curve g of the electron-photon time correlation. The identification module of the computing device 5 can identify the sample 6 more accurately with a combination of the fluorescence lifetimes or the emission transition probabilities obtained from the curve g of the electron-photon time correlation and the curve of the electron-photon time correlation.

As shown in FIG. 1, the device 7 for measuring electron-photon correlation, which is a passive detection system, can be provided as an attachment to be added to the existing electron microscope body 8. The device 7 for measuring electron-photon correlation includes the electron detector 3, the photon detector 4, and the computing device 5. The electron detector 3 and the photon detector 4 may be housed in a housing (not shown) and configured to be energized from outside via a power terminal provided on the housing. In this case, the housing is attached to the existing electron microscope body 8, for example, with a fixture so that the electron detector 3 can detect the electrons 30 transmitted through the sample 6 and that the photon detector 4 can detect the photons 40 emitted from the sample 6 through the photon detection window 82. In addition, the photon detection module 32 of the electron detector 3 may also serve as the photon detector 4. In this case, the photon detection windows 81 and 82 of the chamber of the existing electron microscope body 8 are provided close to each other or are the same window.

The existing electron microscope body 8 may be a transmit electron microscope or a scan electron microscope, and does not need a massive and expensive pulsed electron gun; thus the device 7 for measuring electron-photon correlation can be incorporated into most of typical existing electron microscope bodies 8 as an attachment. For this reason, a fluorescence lifetime microscope with excellent spatial resolution is easily achieved at low cost.

Figure 4:
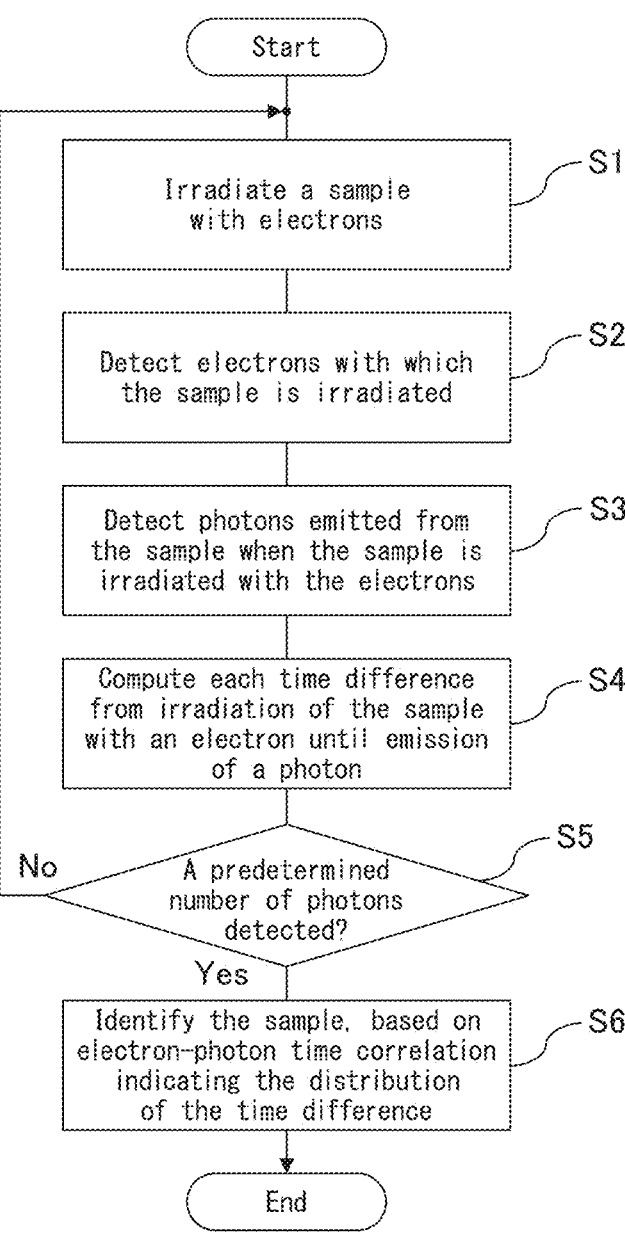
FIG. 4 is a flowchart outlining a method for measuring electron-photon correlation of the first embodiment.

FIG. 4 is a flowchart outlining a method for measuring electron-photon correlation of the first embodiment.

In step S1, the electron gun 2 irradiates a sample 6 with electrons 20.

In step S2, the electron detector 3 detects electrons 30 with which the sample 6 is irradiated.

In step S3, the photon detector 4 detects photons 40 emitted from the sample 6 when the sample 6 is irradiated with the electrons 30.

In step S4, the computing device 5 computes, for each detected photon 40, a time difference between the time of irradiation of the sample 6 with the electron 30 and the time of emission of the photon 40 from the sample 6, based on the time of detection of the electron 30 by the electron detector 3 and the time of detection of the photon 40 by the photon detector 4.

In step S5, the computing device 5 determines whether a predetermined number of photons 40 necessary for computing electron-photon time correlation satisfying a required accuracy are detected. When a predetermined number of photons 40 are not detected (No in step S5), the computing device 5 repeats steps S1 to S5.

When a predetermined number of photons 40 are detected (Yes in step S5), the computing device 5 computes electron-photon time correlation indicating the distribution of the time difference in step S6.

Second Embodiment

Figure 5:
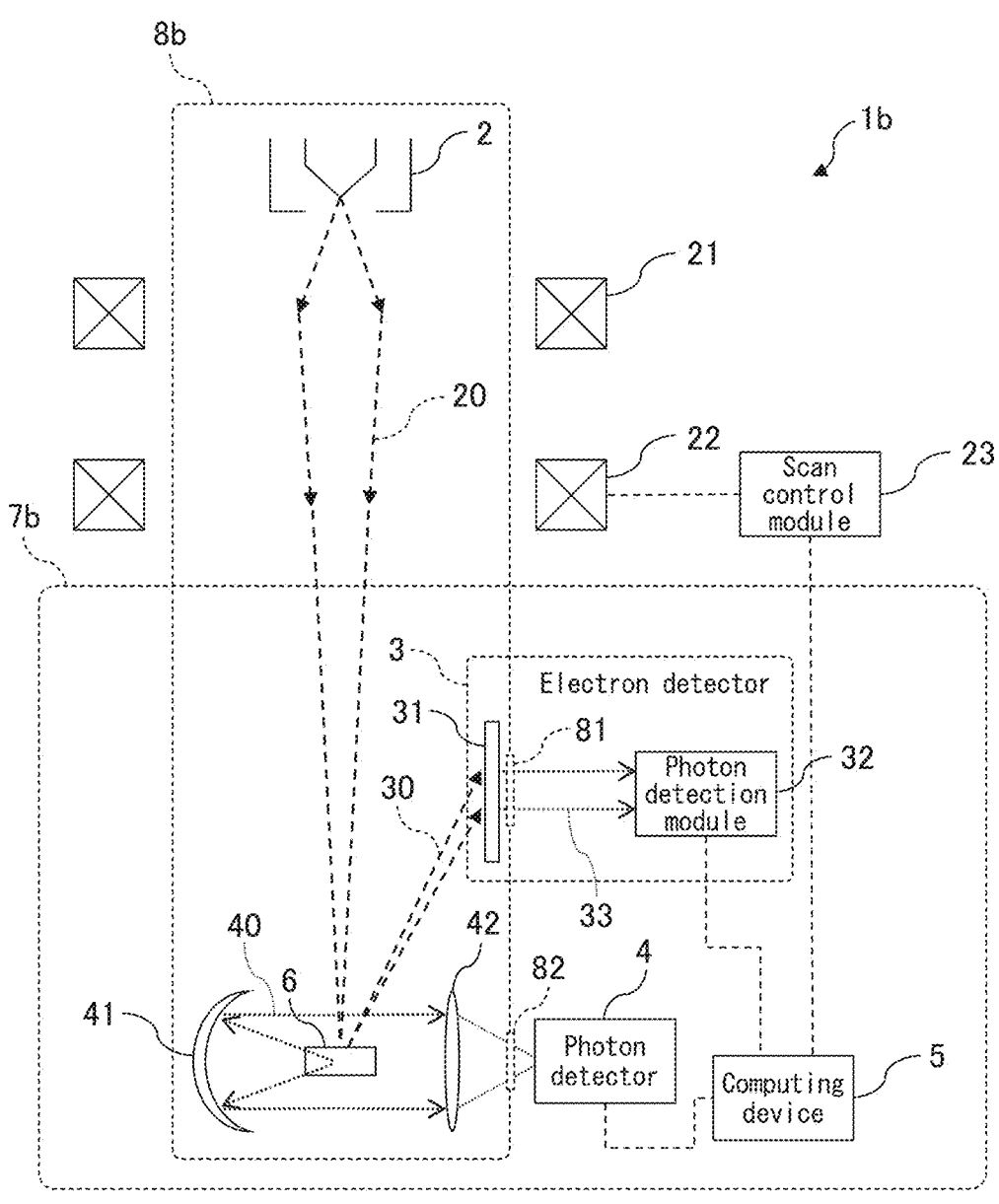
FIG. 5 schematically shows the configuration of an electron microscope and a device for measuring electron-photon correlation of a second embodiment.

FIG. 5 schematically shows the configuration of an electron microscope 1b and a device 7b for measuring electron-photon correlation of a second embodiment. The electron microscope 1 shown in FIG. 1 described above is a transmission electron microscope that detects the electrons 30 transmitted through the sample 6 among the electrons 20 radiated from the electron gun 2, whereas the electron microscope 1b shown in FIG. 5 is a scanning electron microscope that detects electrons 30 reflected by a sample 6 among electrons 20 radiated from the electron gun 2 onto the sample 6. The electron microscope 1b is also achieved by adding the device 7b for measuring electron-photon correlation, which is a passive detection system, to an existing scanning electron microscope body 8 including the electron gun 2 and a chamber. The following describes the differences from the electron microscope 1 shown in FIG. 1.

The electron detector 3 detects electrons 30 reflected by the sample 6 or secondary electrons emitted from the sample 6 among the electrons 20 radiated from the electron gun 2 onto the sample 6. To this end, the electron detector 3 is disposed on the same side as the electron gun 2 with respect to the sample 6 so that the electrons 30 radiated onto the sample 6 and reflected by the sample 6 or the secondary electrons emitted from the sample 6 can be detected. The computing device 5 computes, for each detected photon 40, a time difference between the time of reflection of an electron 30 on the sample 6 or emission of a secondary electron from the sample 6 and the time of emission of the photon 40 from the sample 6. Such a configuration of the scanning electron microscope shown in FIG. 5 also provides an electron microscope, a device for measuring electron-photon correlation, and a method for measuring electron-photon correlation with high spatial resolution less than 10 nm.

As described above, the electron microscope of the embodiment includes an electron gun for irradiating a sample with electrons; an electron detector for detecting the electrons with which the sample is irradiated; a photon detector for detecting photons emitted from the sample when the sample is irradiated with the electrons; and a computing device that computes, for each of the detected photons, a time difference between the time of irradiation of the sample with the electron and the time of emission of the photon from the sample, based on the time of detection of the electron by the electron detector and the time of detection of the photon by the photon detector, and that computes electron-photon time correlation indicating the distribution of the time difference. This provides a method for measuring electron-photon correlation with high spatial resolution less than 10 nm. This provides an electron microscope, a device for measuring electron-photon correlation, and a method for measuring electron-photon correlation with high spatial resolution.

Note that the above embodiments merely illustrate examples for carrying out the present invention, and the technical scope of the present invention is not limited thereto. In other words, the present invention can be carried out in various ways without departing from its technical idea or main features.

What is claimed is:

1. An electron microscope comprising:
   an electron gun for irradiating a sample with electrons;
   an electron detector for detecting the electrons with which the sample is irradiated;
   a photon detector for detecting photons emitted from the sample when the sample is irradiated with the electrons; and
   a computing device that computes, for each of the detected photons, a time difference between the time of irradiation of the sample with the electron and the time of emission of the photon from the sample, based on the time of detection of the electron by the electron detector and the time of detection of the photon by the photon detector, and that computes electron-photon time correlation indicating the distribution of the time difference, wherein
   the computing device includes an identification module that identifies the sample, based on the electron-photon time correlation.

2. The electron microscope according to claim 1, wherein the electron detector detects the electrons transmitted through or reflected by the sample.

3. The electron microscope according to claim 1, wherein the identification module computes a fluorescence lifetime or an emission transition probability of the sample from the electron-photon time correlation, and identifies the sample, based on the fluorescence lifetime or the emission transition probability.

4. The electron microscope according to claim 3, wherein the identification module computes, from the electron-photon time correlation, a curve indicating the frequency at which the photon is detected with the time difference when the electron is detected, computes the emission transition probability of the sample from a peak value at the origin of the curve, and computes the time required for the value of the curve to decrease by a factor of 1/e as the fluorescence lifetime of the sample.

5. The electron microscope according to claim 1, wherein the computing device includes a storage that stores a parameter value indicating a characteristic of electron-photon time correlation measured in advance regarding one or more known substances or organisms, and the identification module computes the degree of matching between a parameter value of the computed electron-photon time correlation of the sample and a parameter value of electron-photon time correlation of a known substance or organism, and identifies a substance or an organism of the sample as a known substance or organism having a parameter value such that the degree of matching exceeds a predetermined threshold and is a maximum.

6. The electron microscope according to claim 1, wherein the electron detector includes:

an emitter that reacts to the electrons with which the sample is irradiated to emit photons; and a photon detection module that detects photons emitted from the emitter to output a detection signal to the computing device.

7. The electron microscope according to claim 6, wherein the photon detector also serves as the photon detection module of the electron detector, and detects the photons emitted from the sample and photons emitted from the emitter to output a detection signal to the computing device.

8. The electron microscope according to claim 1, wherein the electron gun irradiates the sample while scanning the electrons spatially, and the computing device includes an image generation module that generates an image of the sample, based on a spatial change of the electron-photon time correlation.

9. A device for measuring electron-photon correlation, comprising:

an electron detector for detecting electrons radiated from an electron gun of an electron microscope onto a sample;

a photon detector for detecting photons emitted from the sample when the sample is irradiated with the electrons; and a computing device that computes, for each of the detected photons, a time difference between the time of irradiation of the sample with the electron and the time of emission of the photon from the sample, based on the time of detection of the electron by the electron detector and the time of detection of the photon by the photon detector, and that computes electron-photon time correlation indicating the distribution of the time difference, wherein the computing device includes an identification module that identifies the sample, based on the electron-photon time correlation.

10. A method for measuring electron-photon correlation, comprising:

irradiating a sample with electrons;

detecting the electrons with which the sample is irradiated;

detecting photons emitted from the sample when the sample is irradiated with the electrons;

computing, for each of the detected photons, a time difference between the time of irradiation of the sample with the electron and the time of emission of the photon from the sample, based on the time of detection of the electron and the time of detection of the photon, and computing electron-photon time correlation indicating the distribution of the time difference, and identifying the sample, based on the electron-photon time correlation.

\* \* \* \* \*